(12) United States Patent
Loo et al.

(10) Patent No.: US 7,407,844 B2
(45) Date of Patent: Aug. 5, 2008

(54) PLANAR DUAL GATE SEMICONDUCTOR DEVICE

(75) Inventors: Josine Loo, Leuven (BE); Youri Ponomarev, Leuven (BE)

(73) Assignee: NXP B.V., Eindhoven (NL)

( * ) Notice: Subject to any disclaimer, the term of this patent is extended or adjusted under 35 U.S.C. 154(b) by 150 days.

(21) Appl. No.: 11/597,816

(22) PCT Filed: May 25, 2005

(86) PCT No.: PCT/IB2005/051681

§ 371 (c)(1),
(2), (4) Date: Nov. 22, 2006

(87) PCT Pub. No.: WO2005/417132

PCT Pub. Date: Dec. 8, 2005

(65) Prior Publication Data

US 2007/0232003 A1    Oct. 4, 2007

(30) Foreign Application Priority Data

May 25, 2004   (GB)   ................................. 0411621.6

(51) Int. Cl.
*H01L 21/00*    (2006.01)
(52) U.S. Cl. .................... 438/151; 438/157; 438/176
(58) Field of Classification Search ................ 438/151, 438/157, 176, 197, 455
See application file for complete search history.

(56) References Cited

U.S. PATENT DOCUMENTS

| 5,736,435 | A  | 4/1998  | Venkatesan et al. |
| 6,521,940 | B1* | 2/2003  | Vu et al. ................... 257/315 |
| 6,593,192 | B2  | 7/2003  | Zahurak et al. |
| 6,639,246 | B2* | 10/2003 | Honda ......................... 257/72 |
| 6,759,282 | B2* | 7/2004  | Campbell et al. .......... 438/149 |

FOREIGN PATENT DOCUMENTS

WO    WO 2005/022648    3/2005

OTHER PUBLICATIONS

Horie H et al: "Advanced Soi Devices Using CMP and Wafer Bonding": Extended Abstracts of the Intn. Conf. on Solid State Devices and Materials; Japan Society of Applied Physics; Tokyo JP vol. Con. 1996; pp. 473-475.

* cited by examiner

*Primary Examiner*—Tuan H Nguyen
(74) *Attorney, Agent, or Firm*—Peter Zawilski

(57) ABSTRACT

A method of fabricating a dual-gate semiconductor device is provided in which silicidation of the source and drain contact regions (34, 36) is carried out after the first gate (12) is formed on part of a first surface (14) of a silicon body (16) but before forming a second gate (52) on a second surface (44) of the silicon body which is opposite the first surface. The first gate (12) serves as a mask to ensure that the silicided source and drain contact regions are aligned with the silicon channel (18). Moreover, by carrying out the silicidation at an early stage in the fabrication, the choice of material for the second gate is not limited by any high-temperature processes. Advantageously, the difference in material properties at the second surface of the silicon body resulting from silicidation enables the second gate to be aligned laterally between the silicide source and drain contact regions.

9 Claims, 3 Drawing Sheets

PLANAR DUAL GATE SEMICONDUCTOR DEVICE

Figure 1:
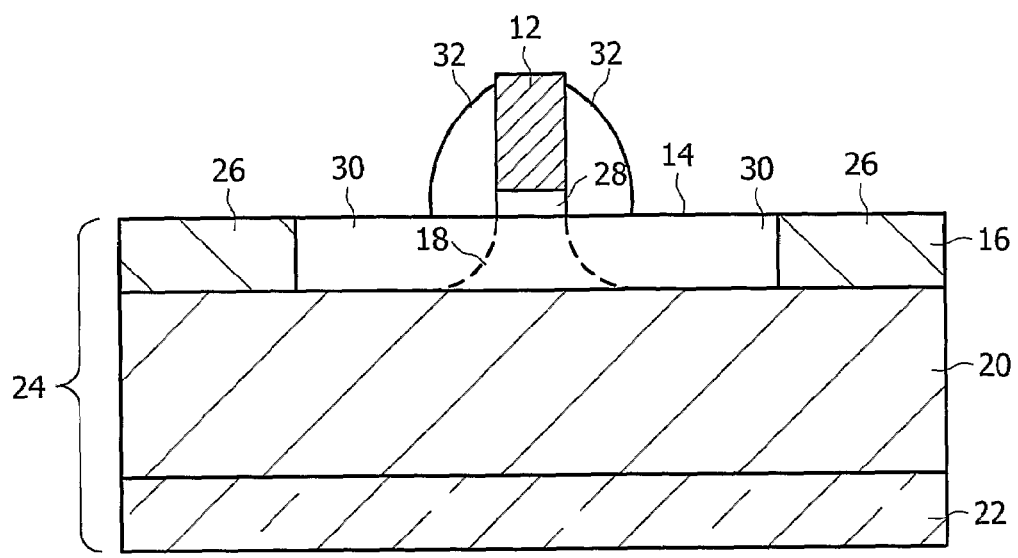

The invention relates to a dual-gate semiconductor device having a silicon body which comprises a channel and source and drain contact regions separated laterally by the channel.

The desire for smaller and more compact electronic devices in today's electronics market presents the challenge to manufacturers to provide smaller and more compact integrated circuits (ICs) and other semiconductor devices. Metal-oxide-semiconductor field-effect transistors (MOSFETs) are primary components of most ICs and, therefore, occupy a significant amount of wafer space. Reducing the size of MOSFETs in ICs, for sub-50 nm CMOS applications for example, plays a significant role in meeting the size-reduction challenge.

Several problems are associated with reducing the size of transistor devices. For example, short-channel effects are more likely to become apparent when the length of the conduction channel is made shorter. These effects are caused by the extension of the depletion region of the drain into the channel under the influence of a voltage on the drain. To suppress short-channel effects it is known to provide a transistor structure having more than one gate. Each gate is arranged to control the conduction of the channel by applying a voltage thereto from more than one direction.

An example of such a structure is the planar dual-gated MOSFET which has two gates that are positioned on opposite surfaces of a semiconductor body comprising the channel, separated therefrom by respective gate dielectrics. Without accurate alignment of the gates with each other, short-channel effects can result in inferior device performance. Moreover, any undesirable overlap between the gates and the channel may cause increased capacitances leading to reduced device speed. Such alignment errors are compounded by any reduction in device size. Therefore, accurate alignment of the gates with respect to the channel and with each other becomes critical to device performance for small MOSFETs, for example with those having gate lengths <100nm.

U.S. Pat. No. 6,593,192 discloses an example method of forming a dual-gate semiconductor-on-insulator (SOI) device in which a first gate is aligned with a second gate, each being formed on opposing sides of a semiconductor layer. In this, first gate structures are formed over active areas before a masking layer is deposited and patterned to expose regions of the semiconductor layer not covered by the first gate structures. Contact openings are then etched through source and drain regions and into an underlying insulator layer via windows in the masking layer. The contact openings are then filled with a conductive material to form source and drain contact structures. A handle wafer is bonded to the upper surface of the structure and the bulk substrate is removed to expose the insulator layer as well as the source and drain contact structures. As shown in FIG. 8 of U.S. Pat. No. 6,593,192, portions of the insulator layer 20 are removed to form openings 26 between adjacent source and drain contact structures 58. Such removal can be accomplished by depositing a masking layer and patterning the layer to expose the desired areas of layer 20 which are then etched by an appropriate etching process that selectively removes the material of layer 20 and not the material of the contact structures 58. Second transistor gate structures 95 are then formed within the openings 26, as shown in FIG. 9 of U.S. Pat. No. 6,593,192.

The second gate structures are self-aligned to the first transistor gate structures 45 and to the channel region therebetween. The source and drain contact structures 58 provide for the alignment of the first and second transistor gate structures. However, in order to form the deep source and drain contact structures in the device described in U.S. Pat. No. 6,593,192, several processing steps are necessary to ensure that the structures are aligned to the channel regions.

It is an object of the present invention to provide an improved method of fabricating a dual-gate semiconductor device.

It is another object of the present invention to provide a method of fabricating a dual-gate semiconductor device having fewer processing steps to that disclosed in U.S. Pat. No. 6,593,192.

According to the present invention there is provided a method of fabricating a dual-gate semiconductor device having a silicon body which comprises a channel and source and drain contact regions separated laterally by the channel, the method comprising the steps of, forming a first gate on part of a first surface of a silicon body, thereby defining a channel in the silicon body under the first gate, siliciding regions of the silicon body not covered by the first gate, so as to define silicide source and drain contact regions, and then, forming a second gate on a second surface of the silicon body which is opposite the first surface, wherein the second gate is aligned laterally between the silicide source and drain contact regions.

By siliciding the source and drain contact regions before the formation of the second gate, the difference between the material of the source and drain and the silicon body at the second surface can be exploited to align the second gate with the first gate. Advantageously, the siliciding process does not require the masking layer needed by the method taught by U.S. Pat. No. 6,593,192 to etch deep contact openings. In fact, the first gate serves as a mask during silicidation of the silicon body. Therefore, the silicided source and drain contact regions are inherently self aligned with the first gate. This reduction in the number of required process steps provides for a faster, and therefore cheaper, fabrication flow.

The silicidation is carried out before the formation of the second gate. Therefore, the relatively high temperature range associated with silicidation does not limit the choice of material used for the second gate and, thereby, provides a more flexible process.

In a preferred embodiment, the second gate is formed in a recess which is formed in the second surface between the silicide source and drain contact regions. The recess can be formed simply by selectively etching, from the second surface, a portion of the silicon between the silicide source and drain contact regions. Such selective etching is enabled by the difference in properties of the silicided source/drain contacts and the silicon body portion at the second surface (remote from the first gate). For example, the second surface of the silicon body can be oxidised. The silicide source/drain contacts will not become oxidised which allows the oxidised silicon to be selectively etched to form the recess. Preferably, insulating spacers are formed within the recess before forming the second gate to prevent contact between the second gate and the silicide source and/or drain contact regions.

Spacers may be formed adjacent the first gate on the first surface before the silicide source and drain contact regions are defined. These spacers are employed to mask off regions of the silicon body so that dopant can be implanted through an exposed part of the first surface so as to define junction regions adjacent the channel.

Figure 4:
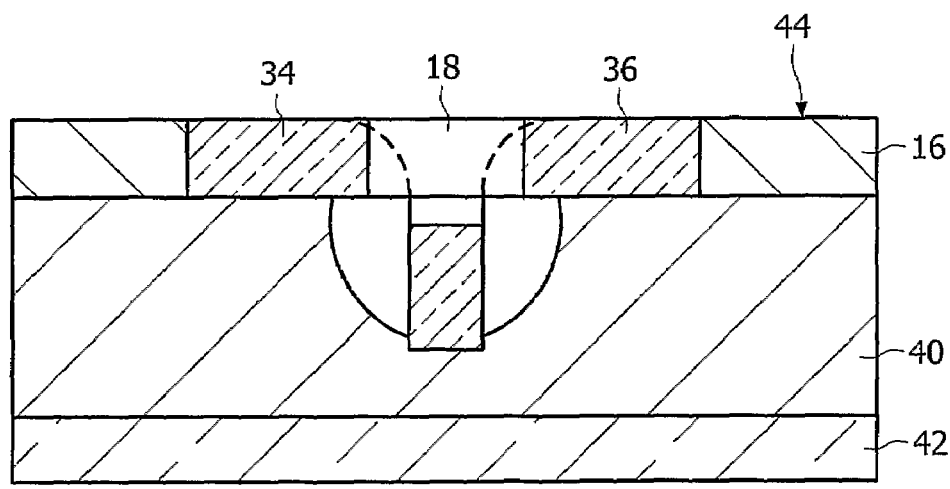
Figure 5:
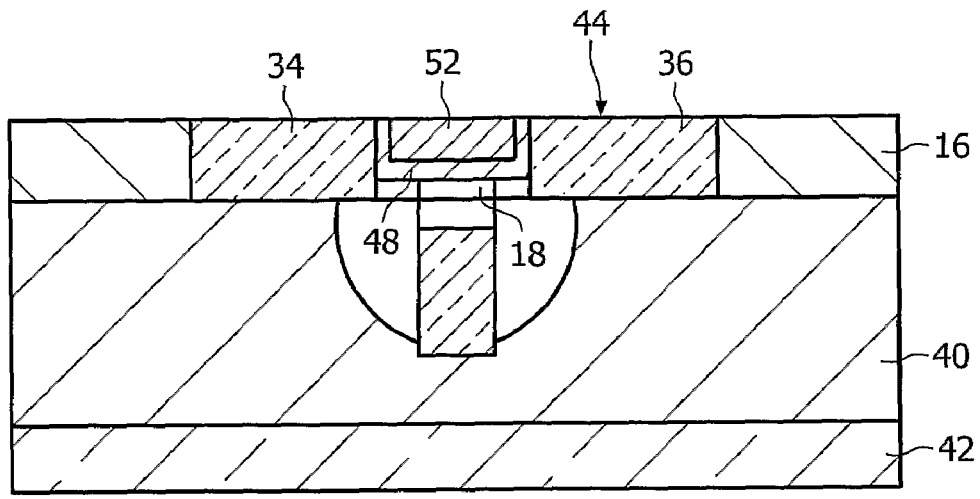
Figure 6:
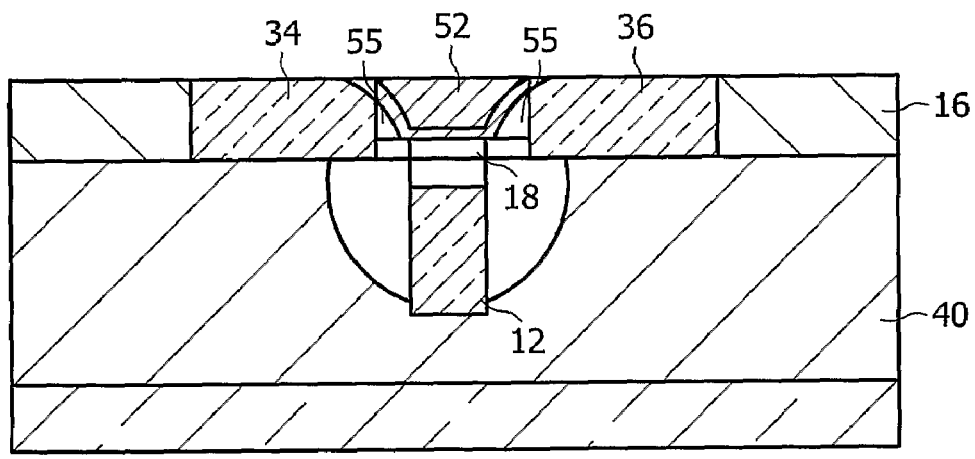

The invention will now be described, by way of example only, with reference to the accompanying drawings wherein;

FIGS. 1 to 5 show sectional views of a dual-gate semiconductor device at various stages of manufacture according to a first embodiment of the invention; and, FIG. 6 shows a sectional view of a dual-gate semiconductor device fabricated according to a second embodiment of the invention.

It will be appreciated that the figures are merely schematic and are not drawn to scale. In particular certain dimensions such as the thickness of layers or regions may have been exaggerated whilst other dimensions may have been reduced. The same reference numerals are used throughout the figures to indicate the same or similar parts.

An example embodiment of a method of fabricating a dual-gate semiconductor device according to the invention will now be described with reference to FIGS. 1 to 5. It should be appreciated by the skilled person that various known semiconductor processing techniques can be employed in the following described method to deposit, pattern, etch and dope various conducting, insulating and semiconductor structures on a silicon wafer. For example, low pressure chemical vapour definition (LPCVD) may be used to deposit conductive layers which can be subsequently patterned as required.

A first gate 12 is formed on part of a first surface 14 of a silicon body 16, thereby defining a channel 18 in the silicon body under the first gate, as shown in FIG. 1. The silicon body 16 is bonded to an insulating layer 20 which is supported by a first substrate 22 thereby forming a silicon-on-insulator (SOI) wafer 24 in which the insulating layer 20 is of silicon oxide for example. This insulating layer is commonly referred to as the buried oxide of the SOI wafer. The silicon body is thinned down using sequential silicon oxidation and wet etching of the oxide to a thickness of 30-60 nm, typically 40 nm.

Before the first gate 12 is formed, isolation regions 26 must be formed in the silicon body 16. These serve to prevent electrical interference between neighbouring semiconductor devices on the same wafer and are formed using known techniques such as shallow trench isolation. A gate insulating layer of silicon oxide or high-K is then grown or deposited to provide a gate dielectric 28 for the first gate 12.

As an alternative to shallow trench isolation, local oxidation of silicon (LOCOS) could be employed to isolate adjacent active regions. Since the silicon body sufficiently thin, only a thin oxidation would be needed if LOCOS is used. This will ensure small lateral extension of the LOCOS oxide into the active region, a so-called "Birdsbeak". Another processing option would be to simply etch mesas, or islands, of silicon isolated by the buried oxide (BOX).

A polycrystalline silicon (polysilicon) layer is then deposited on the gate insulating layer. This is patterned and etched together with the gate insulating layer to define the first gate 12 which is separated from the silicon channel 18 by the gate dielectric 28. Alternatively, metal, or any other highly-conductive material, electrode can be used to form the gate.

Doped junction regions 30 are then defined in the silicon body 16 laterally spaced by the channel 18. This definition process requires forming a pair or spacers 32, formed of oxide, nitride or a combination of both, each side adjacent the first gate 12 on the first surface 14 of the silicon body. The spacers 32 have dimensions of approximately 45 nm. Dopant, n-type (e.g. As or P) for NMOS, or p-type (B or In) for PMOS, is then implanted through the exposed part of the first surface 14 of the silicon body 16. This is activated by heating. Normally a very short duration of <1second at the peak temperature, so-called "spike" Rapid Thermal Annealing (RTA) is used, with very high ramp up and ramp down rates (above 100°/s). This, as a consequence, causes the dopant to diffuse partly under the spacers 32 but not into the channel 18.

Figure 2:
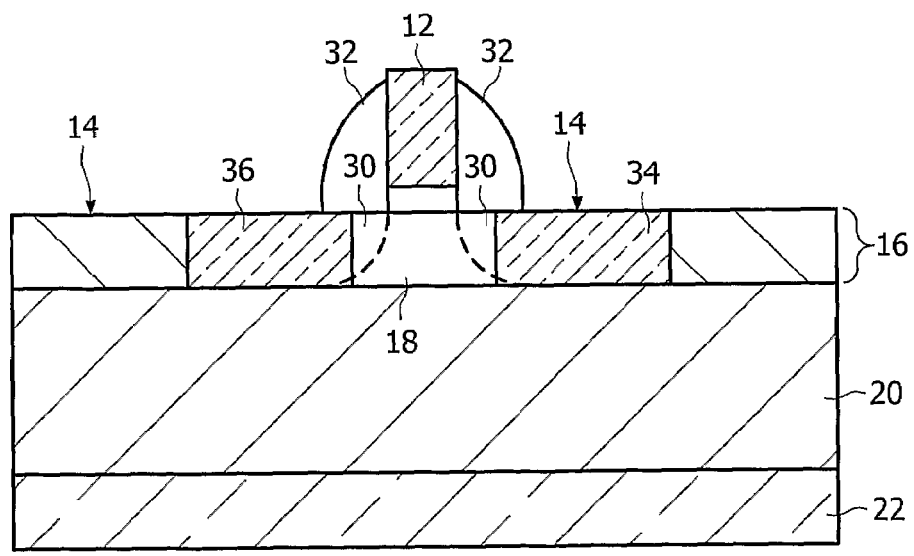

With reference to FIG. 2, common CMOS self-aligned silicidation processing is then used to silicide regions of the silicon body 16 not covered by the first gate 12, so as to define silicide source and drain contact regions 34, 36. This siliciding process involves depositing a layer of metal, nickel, cobalt or titanium for example, over the first surface 14. This is then heated by RTA to temperatures of approximately 380-450° C. so as to anneal the nickel to form silicide source and drain contact regions 34, 36 in the silicon body thereunder. The remaining nickel layer, (that which has not reacted with the underlying silicon) is then removed from the first surface 14.

Alternatively, cobalt or titanium, for example, may be used instead of nickel. For Cobalt, the temperature to form the silicide is around 700° C. and for Titanium a temperature of around 850° C. is required.

As well as the source and drain contact regions 34, 36, the first gate 12 is exposed to the silicidation process and, therefore, becomes silicided.

During the silicidation process the first gate 12 and insulating spacers 32 serve as a natural mask which means that the silicide source and drain contact regions 34, 36 are inherently self-aligned with the first gate 12. Moreover, the presence of the insulating spacers 32 ensures that bridging between the silicided regions is avoided.

The silicide is formed through the thickness of the silicon body down to the buried oxide 20. The thickness and any lateral extension of the silicide depends on the amount of nickel deposited and the thickness of the silicon layer. If a large amount of nickel is deposited, the silicide may extend underneath the spacer as shown. Advantageously, this reduces the series resistance of the device.

An amorphisation implant (not shown) can be carried out to amorphize the source and drain contact regions 34, 36 before silicidation. The silicidation process is typically faster in amorphized silicon than in crystalline silicon. Therefore, by choosing an appropriate thermal budget, the silicide can be blocked to stop it crossing the interface with the channel.

The silicon channel 18, together with doped junction regions, is defined between the laterally spaced silicide source and drain contact regions 34, 36. Due to the inherent self-alignment of the source and drain contact regions, the channel is aligned with the overlying first gate stack.

Figure 3:
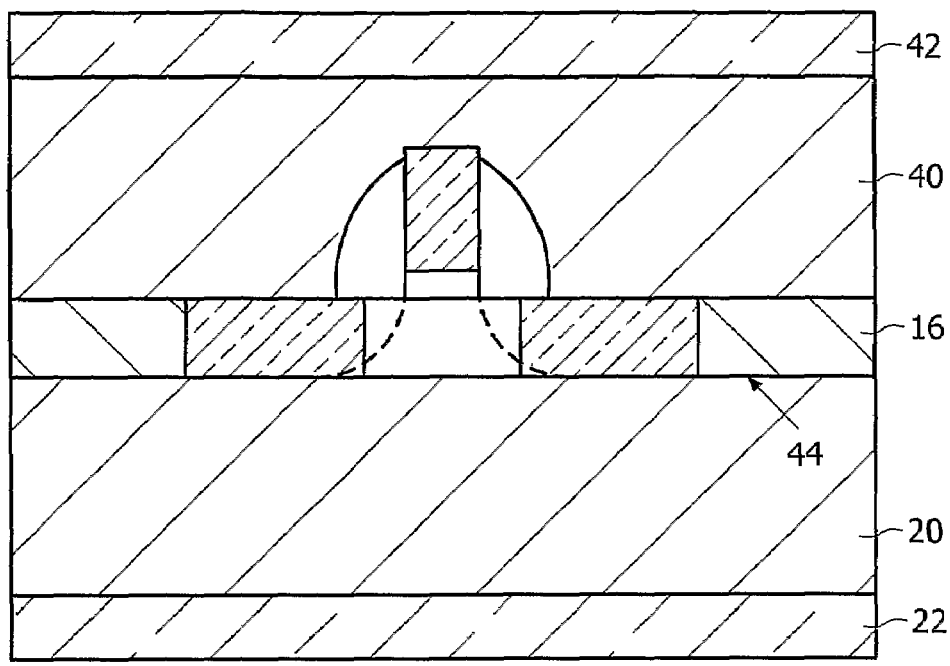

With reference to FIG. 3, a second wafer is bonded to the structure shown in FIG. 2 by oxide fusion bonding. In this, a second insulating layer of silicon oxide 40 serves to bond a second substrate 42 to the first gate 12 and the exposed part of the first surface 14 of the silicon body 16. This second wafer 40,42 is commonly referred to as a handling wafer because it facilitates handling of the semiconductor device whilst the first wafer is removed for processing of the opposite side of the silicon body 16 (backside processing).

Once the second wafer is bonded to the silicon body, the first substrate 22 and the insulating layer 20 are removed so as to expose the second surface 44 of the silicon body 16. This removal can be carried out by a chemical wet etch or grinding or a combination of both.

FIG. 4 shows the semiconductor device after removal of the first substrate and the insulating layer and after the whole structure has been turned upside-down for backside processing.

The then-exposed second surface 44 of the silicon body 16 is subjected to an oxidation process. This serves to oxidise the silicon of the channel 18 to a depth of approximately 60 nm but not the silicide source and drain contacts 34, 36.

A selective etch is then carried out to remove the oxidised silicon to form a recess in the second surface 44 between the silicide source and drain contact regions 34, 36. For example a buffered oxide etch (BOE) can be used to remove the oxide. The recess formed is aligned with the first gate and the silicon channel because the extent of the selective etch is limited by the sidewalls of the silicide source and drain contacts. Following the selective etch, a portion of the silicon body opposite the first gate 12 remains. This remaining portion forms the conduction channel 18 for the final device and which channel is aligned with the first gate 12 and the recess.

Advantageously, the thickness of the channel 18 can be easily controlled by the extent to which the exposed second surface 44 of the silicon body 16 is oxidised during the oxidation step. Typically, the thickness of the channel is 10 nm and the thickness of the silicide source and drain contact regions 34, 36 remains at 40-50 nm. The thicker source and drain ensures that the device has a low series resistance whilst the thin channel, having a well-controlled thickness, is fully controllable by the gates, resulting in a device having appropriate transistor characteristics.

A gate insulator layer, of silicon oxide for example, is deposited over the second surface of the silicon body 16. This is then patterned to form a gate dielectric 48 within the recess. A second gate 52 is then formed on the second surface of the silicon body by depositing a layer of polysilicon or metal over the second surface and patterning. It will be appreciated, however, that a conductive material other than polysilicon could be used to form the second gate 52. By carrying out the silicidation before the formation of this second gate stack, the melting temperature of the material does not limit the choice.

The second gate 52 is aligned laterally between the silicide source and drain contact regions 34, 36. This ensures that the second gate is also aligned with the first gate 12 and the channel 18 thereby providing a dual-gate semiconductor device having desirable electrical characteristics.

The gate dielectric 48, as shown in FIG. 5, provides insulation between the second gate 52 and the silicide source and drain contact regions 34, 36, as well as the channel 18. However, to improve the insulation and reduce any risk of shorting due to poor step coverage, insulating spacers 55 can be formed within the recess before forming the second gate, as shown in FIG. 6. The spacers can also serve to reduce overlap between the second gate and the junction regions 30 which could cause unwanted capacitative effects.

The thickness of the second gate 52 is determined by the depth of the recess in the second surface 44. It will be appreciated by the skilled person, however, that this thickness can be more or less than the depth of the recess by appropriate processing.

Although it is envisaged that oxidation is performed on the second surface 44 of the silicon body before selectively etching the recess, it will be appreciated that other etching techniques could be adopted. This is possible because the exposed second surface after removal of the insulating layer 20 comprises two different materials, the silicide of the source and drain contact regions 34, 36, and the silicon opposite the first gate 12. For example, the silicon can be directly etched away selectively towards the silicide regions, thereby forming a recess without oxidation.

Despite the clear advantages of providing a self-aligned recess for forming the second gate stack therein, it is envisaged that the difference in material properties on the second surface could allow the second gate stack (dielectric and gate) to be formed directly thereon without forming a recess. For example, the conditions used during the silicidation process could be adapted to cause the silicide source and drain contact regions 34, 36 to protrude from the second surface 44 by a small amount beyond the unaffected silicon. Such protrusion is effected by the natural gain in volume that silicon undergoes when converted to silicide. This would effectively form small steps in the second surface, at the interface between the different materials, which can be advantageously exploited to align the second gate 52 with the first gate 12.

In summary, with reference to FIG. 5, there is provided a method of fabricating a dual-gate semiconductor device in which silicidation of the source and drain contact regions 34, 36 is carried out after the first gate 12 is formed on part of a first surface 14 of a silicon body 16, but before forming a second gate 52 on a second surface 44 of the silicon body, which is opposite the first surface. The first gate 12 serves as a mask to ensure that the silicided source and drain contact regions are aligned with the silicon channel 18. Moreover, by carrying out the silicidation at an early stage in the fabrication, the choice of material for the second gate is not limited by any high-temperature processes. Advantageously, the difference in material properties at the second surface of the silicon body resulting from silicidation enables the second gate to be aligned laterally between the silicide source and drain contact regions.

From reading the present disclosure, other modifications will be apparent to persons skilled in the art. Such modifications may involve other features which are already known in the design, manufacture and use of dual-gate semiconductor devices and component parts thereof, and which may be used instead of or in addition to features already described herein. Although claims have been formulated in this application to particular combinations of features, it should be understood that the scope of the disclosure of the present application also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention. The applicants hereby give notice that new claims may be formulated to such features and/or combinations of features during the prosecution of the present application or of any further application derived therefrom.

The invention claimed is:

1. A method of fabricating a dual-gate semiconductor device having a silicon body which comprises a channel and source and drain contact regions separated laterally by the channel, the method comprising the steps of:

forming a first gate on part of a first surface of a silicon body, thereby defining a channel in the silicon body under the first gate;

siliciding regions of the silicon body not covered by the first gate, so as to define silicide source and drain contact regions and then, forming a second gate on a second surface of the silicon body which is opposite the first surface, wherein the second gate is aligned laterally between the silicide source and drain contact regions.

2. A method according to claim 1, further comprising the step of:

forming a recess in the second surface between the silicide source and drain contact regions before the second gate is formed, wherein the second gate is formed in the recess.

3. A method according to claim 2, wherein the recess is formed by selectively etching, from the second surface, a portion of the silicon between the silicide source and drain contact regions.

4. A method according to claim 3, further comprising the step of:

oxidising the second surface before selectively etching.

5. A method according claim 2, further comprising the step of:

forming at least one insulating spacer within the recess before forming the second gate to prevent contact between the second gate and the silicide source and/or drain contact regions.

6. A method according to claim 1, wherein the second surface of the silicon body is initially bonded to an insulating layer which is supported by a first substrate.

7. A method according to claim 6, further comprising the steps of:

bonding a second substrate to the first gate and the first surface of the silicon body after the silicide source and drain contact regions are defined; and then, removing the first substrate and the insulating layer so as to expose the second surface of the silicon body.

8. A method according to claim 1, further comprising the steps of:

forming at least one spacer adjacent the first gate on the first surface (14); and then, implanting dopant through an exposed part of the first surface so as to define junction regions adjacent the channel before the silicide source and drain contact regions are defined.

9. A method according to claim 1, wherein the siliciding includes the steps of:

depositing a metal layer over the first surface;

annealing the metal layer so as to form silicide source and drain contact regions thereunder; and then, removing the metal layer from the first surface.

* * * * *